(12) United States Patent
Matsui

(10) Patent No.: US 7,649,418 B2
(45) Date of Patent: Jan. 19, 2010

(54) VARIABLE-GAIN AMPLIFIER

(75) Inventor: Naohiro Matsui, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 8 days.

(21) Appl. No.: 11/760,866

(22) Filed: Jun. 11, 2007

(65) Prior Publication Data

US 2007/0296501 A1 Dec. 27, 2007

(30) Foreign Application Priority Data

Jun. 12, 2006 (JP) .............................. 2006-162011

(51) Int. Cl.
*H03G 3/10* (2006.01)

(52) U.S. Cl. ...................... 330/284; 330/254; 330/278; 330/311

(58) Field of Classification Search ................ 330/254, 330/278, 284, 311; 333/81 R
See application file for complete search history.

(56) References Cited

U.S. PATENT DOCUMENTS

| 6,812,771 | B1 * | 11/2004 | Behel et al. ................. 330/254 |
| 7,321,266 | B2 * | 1/2008 | Chiang ...................... 330/254 |
| 2007/0222515 | A1 * | 9/2007 | Koutani et al. ............... 330/311 |

FOREIGN PATENT DOCUMENTS

| JP | 05-259765 A | 10/1993 |
| JP | 2005-136846 A | 5/2005 |

* cited by examiner

*Primary Examiner*—Khanh V Nguyen
(74) *Attorney, Agent, or Firm*—Sughrue Mion, PLLC

(57) ABSTRACT

There is provided a variable-gain amplifier, including two cascode amplifiers and an attenuator. The cascode amplifiers are mutually connected in parallel via the attenuator.

10 Claims, 15 Drawing Sheets

US 7,649,418 B2

1

VARIABLE-GAIN AMPLIFIER

This application is based on Japanese patent application No. 2006-162011, the content of which is incorporated hereinto by reference.

BACKGROUND

1. Technical Field

The present invention relates to a variable-gain amplifier.

2. Related Art

Latest progress in fine gate processing technique has made it possible to apply a CMOS transistor to a GHz RF band, thereby fabricating a wireless system IC including a single chip, through a CMOS process that can integrate a RF-IC and a baseband-IC.

FIG. 11 is a block diagram showing a system configuration of a popular wireless communication terminal. The system includes variable-gain amplifiers at some key points, for absorbing gain fluctuation in a transmitting circuit and a receiving circuit, and adjusting and securing the total gain. Regarding the first-stage amplifier in the receiving circuit in particular, when a signal output from the antenna is weak the amplifier has to have a low-noise and high-gain characteristic for amplifying the signal, and when the signal output from the antenna is intense the amplifier has to have a high linearity in a low gain range, for attenuating the signal. Especially for preventing degradation of a desired wave by a disturbance wave having high signal intensity, such as an adjacent channel disturbance wave, a second adjacent channel disturbance wave or an in-band blocker, strict communication standards are generally provided. Thus, the amplifier employed at the first stage of the receiving circuit is required to provide wide variable range, low noise and high linearity at the same time.

FIG. 12 is a circuit diagram of a variable-gain amplifier disclosed in Japanese Laid-open patent publication No. 2005-136846. This amplifier includes three bipolar transistors Q1, Q2, Q3 that amplify a signal, and a base current control circuit 201. The collector of each transistor Q1, Q2, Q3 is connected to an output terminal "Output", as well as to an end of a resistor RL, which is a common load resistance. The other end of the resistor RL is connected to a power supply line Vcc to which a source voltage is applied. An input terminal "Input" is connected to the base of the transistor Q1 via a capacitor Csr1. The input terminal "Input" is also connected to the base of the transistor Q2, via the capacitor Csr1 and an attenuator AT1 which serves to attenuate an input signal.

The attenuator AT1 includes a capacitor Csr2 serially connected to the base of the transistor Q1, and a capacitor Csh2. The capacitor Csh2 is shunt-connected between a signal path posterior to the capacitor Csr2 (signal path connecting the capacitor Csr2 and the base of the transistor Q2) and the ground. Likewise, the input terminal "Input" is connected to the base of the transistor Q3 via the capacitor Csr1, the attenuator AT1 and an attenuator AT2 serving to attenuate the input signal. The attenuator AT2 includes a capacitor Csr3 serially connected to the base of the transistor Q2, and a capacitor Csh3. The capacitor Csh3 is shunt-connected between a signal path posterior to the capacitor Csr3 (signal path connecting the capacitor Csr3 and the base of the transistor Q3) and the ground.

With such structure, the variable amplifier allows switching between the unit amplifier, and the plurality of attenuators connected in parallel between the signal input terminal and the signal output terminal, and thereby varying the gain and linearity of the variable amplifier as a whole. The number of switch stages may be determined as desired if not fewer than two, and the example of FIG. 12 has three stages.

FIG. 13 is a circuit diagram of the base current control circuit 201 shown in FIG. 12. Referring to FIG. 13, working principle of the circuit of FIG. 12 will be described. With changes of the control voltage Vctrl, the variable-gain amplifier works as follows. While the control voltage Vctrl is sufficiently higher than reference voltages Vr1, Vr2, the transistor Qb2 and the transistor Qb4 of the base current control circuit 201 are turned off. Accordingly, an entirety of a total base current determined by a current mirror circuit for setting the total current is supplied to the base of the transistor Q1 of the amplifier, via the transistor Qb1. The remaining transistors Q2, Q3, are, therefore, turned off.

Under such state, the transistor Q1 receives the signal input to the input terminal "Input" without mediation of the attenuator. Accordingly the gain becomes maximal, and IIP3, which is an index of the linearity of the variable amplifier as a whole, reflects the linearity of the transistor Q1 itself as it is.

As the control voltage Vctrl becomes lower, a part of the current supplied to the base of the transistor Q1 starts to be supplied to the base of the transistor Q2. In other words, with the drop of the control voltage Vctrl, the base current of the transistor Q1 gradually decreases, while the base current of the transistor Q2 gradually increases. Accordingly, transistor Q1 gradually loses the gain with the decrease in collector current. In contrast, the transistor Q2 obtains higher gain with the increase in collector current. As already stated, the gain of the signal path through the transistor Q2 is lower than that of the signal path through the transistor Q1 provided that the base current is equal, and hence the overall gain of the variable amplifier decreases (Ref. FIG. 4 of Japanese Laid-open patent publication No. 2005-136846).

Also as already stated, the signal path through the transistor Q2 has higher linearity than the signal path through the transistor Q1 provided that the base current is equal, and accordingly the overall linearity of the variable amplifier increases. When the control voltage Vctrl becomes still lower, the increase in collector current of the transistor Q2 increases the gain of the transistor Q2, thereby nearly turning off the transistor Q1. Since the input of the transistor Q2 is made via the attenuator AT1 the overall gain of the variable amplifier becomes lower in this case, and the IIP3 of the variable amplifier as a whole presents a value obtained by summing the characteristic of the transistor Q2 itself and the attenuation factor expressed in decibel (dB).

When the control voltage Vctrl drops even further, the transistor Qb1 and the transistor Qb3 are turned off. Accordingly, the entirety of the total base current set by the resistor Rref and the transistors Qref/Qbcs of the base current control circuit 201 is supplied to the base of the transistor Q3 via the transistor Qb1, an the remaining transistors Q1, Q2 are both turned off. Under such state, the signal input to the input terminal "Input" is provided to the transistor Q3 via the attenuators AT1, AT2, and therefore the overall gain of the variable amplifier becomes minimal, while the IIP3 of the variable amplifier as a whole becomes highest.

In the variable-gain amplifier, a sufficient isolation characteristic has to be secured between the input terminal and the output terminal. The amount of isolation of the input/output (hereinafter, I/O) terminal of the first-stage unit amplifier (transistor Q1 in FIG. 12) determines how much attenuation range can be secured. For example, it will be assumed that the amount of isolation between base and collector of the transistor Q1 in FIG. 12 is −20 dB at the frequency of 1 GHz, while a minimum gain of the variable-gain amplifier to be achieved by the combination of the attenuator and the unit amplifier is −30 dB. In this case, since the amount of I/O isolation of the transistor Q1 is −20 dB at 1 GHz, the minimum gain cannot be lowered to −30 dB, but instead determined around −20 dB, which is the amount of isolation of the transistor Q1. Thus, in order to secure a sufficient attenuation range, it is essential to secure the matching amount of I/O isolation of the first-stage unit amplifier.

FIG. 14 is a circuit diagram of another variable-gain amplifier disclosed in Japanese Laid-open patent publication No. 2005-136846. FIG. 15 is a graph for comparing control voltage dependence of the gain and the IIP3 characteristic of the amplifier of FIG. 14. Performing thus a multi-stage cascode connection enables attaining higher isolation. However, because of employing bipolar transistors, which have to be vertically stacked, effective operation cannot be performed unless the source voltage is increased. Consequently, such structure does not provide a sufficient characteristic.

SUMMARY

According to the present invention, there is provided a variable-gain amplifier comprising n (an integer not fewer than 2) pieces of cascode amplifiers each including a plurality of cascode-connected field effect transistors, and an attenuator, wherein the plurality of cascode amplifiers is mutually connected in parallel via the attenuator.

The variable-gain amplifier thus constructed includes the plurality of cascode amplifiers that respectively serves as a unit amplifier. Such structure improves the isolation characteristic. Under such structure, it suffices that a potential close to a saturated drain voltage is provided to the cascode-connected field effect transistors, and hence those transistors can operate with a lower voltage than is required by a bipolar transistor. This eliminates the need to significantly increase the source voltage.

Thus, the present invention provides a variable-gain amplifier that provides a higher isolation characteristic with a low source voltage.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1A:
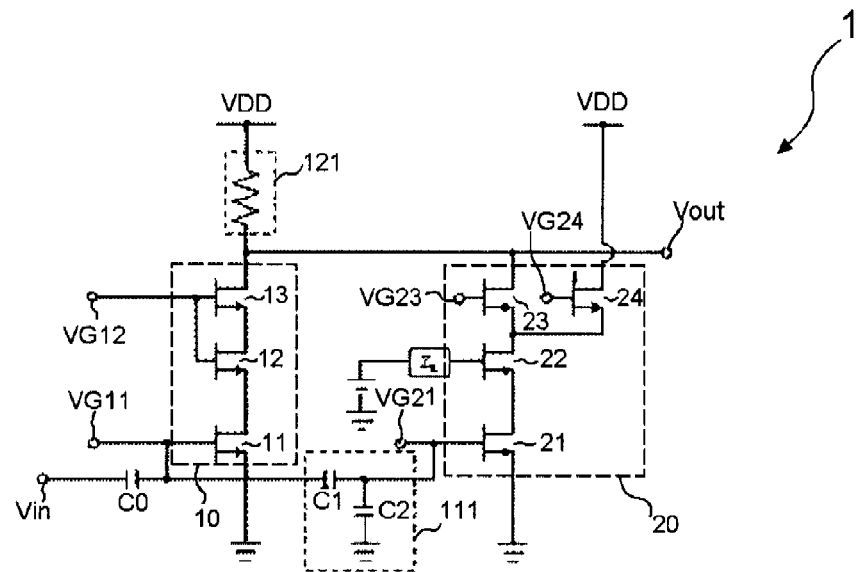
FIG. 1A is a circuit diagram of a variable-gain amplifier according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereunder, exemplary embodiments of a variable-gain amplifier according to the present invention will be described in details, referring to the accompanying drawings. In the drawings, same constituents are given the same numerals, and the description thereof will not be repeated.

FIRST EMBODIMENT

FIG. 1A is a circuit diagram of a variable-gain amplifier according to a first embodiment of the present invention. The variable-gain amplifier 1 includes n pieces of cascode amplifiers 10, 20, and an attenuator 111. n represents an integer not fewer than 2, and in this embodiment n is 2. The cascode amplifiers 10, 20 are mutually connected in parallel, via the attenuator 111.

The first cascode amplifier 10 is connected to an input terminal Vin of the variable-gain amplifier 1 via a capacitor C0. The second cascode amplifier 20 is connected to the input terminal Vin via the capacitor C0 and the attenuator 111. The attenuator 111 includes a capacitor C1 and a capacitor C2. The capacitor C1 is provided on a signal path between the input terminal Vin and the cascode amplifier 20. The capacitor C2 is provided between a signal path between the capacitor CT and the cascode amplifier 20, and the ground.

Each of the cascode amplifiers 10, 20 includes a plurality of cascode-connected field effect transistors (hereinafter, FET). The cascode amplifier 10 includes the FET 11, FET 12, and FET 13. The FETs 11, 12, 13 are of a MOS type. The FET 11 has the source grounded, and the gate connected to a gate control terminal VG11. FET 12 has the source connected to the drain of the FET 11, and the gate connected to a gate control terminal VG12. The FET 13 has the source connected to the drain of the FET 12, and the gate connected to the gate control terminal VG12. The drain of the FET 13 is connected to an end of a load 121. The other end of the load 121 is connected to a power source VDD.

The load 121 may be a passive element such as an inductor or an active element, instead of the resistance load as shown in FIG. 1A. Although a gate bias is provided in common to the FET 12 and the FET 13 in this embodiment, the gate bias may be independently controlled, as long as the gate bias (V) of the FET 12 ≦ gate bias (V) of the FET 13.

The cascode amplifier 20 includes a FET 21, a FET 22, a FET 23 (first FET) and a FET 24 (second FET). The FETs 21, 22, 23, 24 are also of a MOS type. The FET 21 has the source grounded, and the gate connected to a gate control terminal VG21. The FET 22 has the source connected to the drain of the FET 21, and the gate thereof receives a fixed potential. The FET 23 has the source connected to the drain of the FET 22, and the gate connected to a gate control terminal VG23. The FET 24 has the source connected to the drain of the FET 22, and the gate connected to a gate control terminal VG24.

Thus, the FET 23 and the FET 24 have their respective sources mutually connected. The respective drain of the FET 23 and the FET 24 is connected to the load 121 and the power source VDD. With respect to the load 121 which is common to the FET 23 and the FET 24, the former is involved as the gain, while the latter is not. With such structure, the cascade amplifier 20 is constituted as a variable output current type amplifier.

The output terminal of the cascade amplifier 10 (drain of the FET 13) and the output terminal of the cascade amplifier 20 (drain of the FET 23) are both connected to the output terminal Vout of the variable-gain amplifier 1.

Figure 1B:
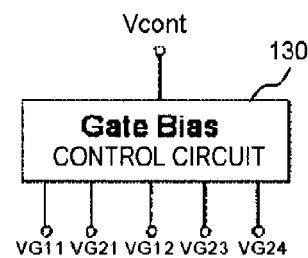
FIG. 1B is a block diagram of a gate bias control circuit.

FIG. 1B is a block diagram of a gate bias control circuit. An output voltage of the gate bias control circuit 130 is applied to each of the gate control terminals VG11, VG12, VG21, VG23, VG24.

An operation of the variable-gain amplifier 1 will now be described. As an example, numerical values will be given as: source voltage Vdd=2.5 V, C1=1 pF, C2=10 pF, gate length of each FET L=0.25 um, and operating frequency=800 MHz.

A. Under a High Gain Setting

When a maximum gain is set (under the above condition, control voltage: 2 to 2.5 V), only the first-stage cascode amplifier 10 operates. The cascode amplifiers are provided in two stages (cascode amplifier 10, 20), in order to upgrade the output impedance and the gain of the first-stage cascode amplifier 10, as well as the isolation between the input terminal and the output terminal. Theoretically, increasing the number of stages results in improved isolation and gain. Actually, however, stacking three or four stages incurs a decrease in linear operation range of the source voltage, for which the only countermeasure is increasing the source voltage. Stacking additional stages also results in increased footprint, which provokes an increase in parasitic capacitance, thereby incurring degradation in frequency characteristic. Taking the both of such drawbacks into consideration, it is advantageous to employ the two-stage cascode connection as shown in FIG. 1A, to operate the amplifier under a low voltage and in a high frequency band.

Figure 2:
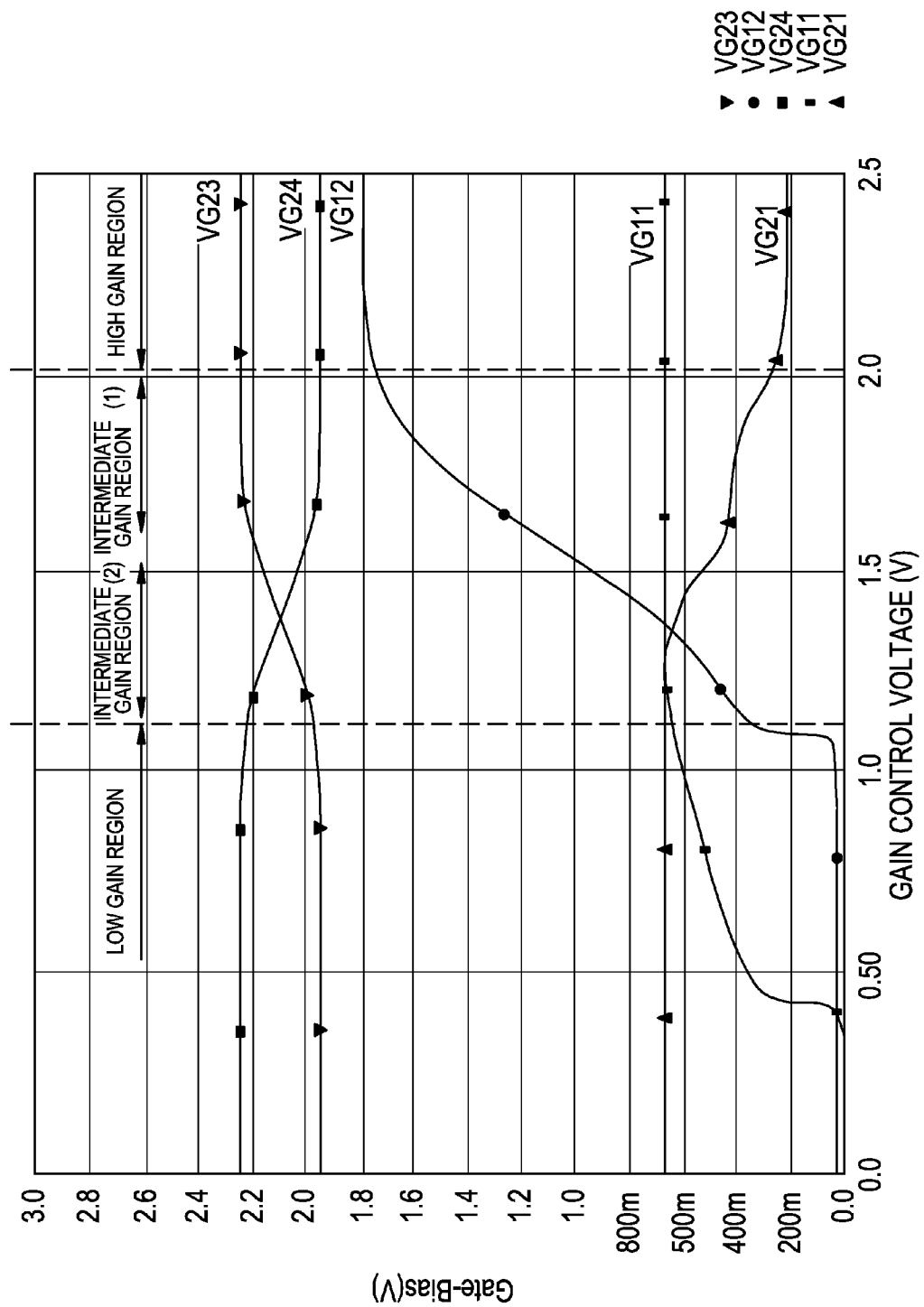
FIG. 2 is a graph for explaining a control characteristic of each gate bias voltage with respect to the gain control voltage in FIG. 1A.

FIG. 2 is a graph for explaining a control characteristic of each gate bias voltage with respect to the gain control voltage in FIG. 1A. The gate bias VG11 for the FET 11 is biased so as to provide a constant current as shown in FIG. 2. The gate bias VG12 for the FETs 12, 13 is biased such that the FET 11 operates in a saturation region, to attain an optimal gain and noise index. Under such state, a voltage close to GND (nearly 0 V) which is lower than a threshold voltage Vt is being applied, and hence no current is supplied to the gate bias VG21 for the FET 21, and therefore the FET 21 is not operating.

Figure 3A:
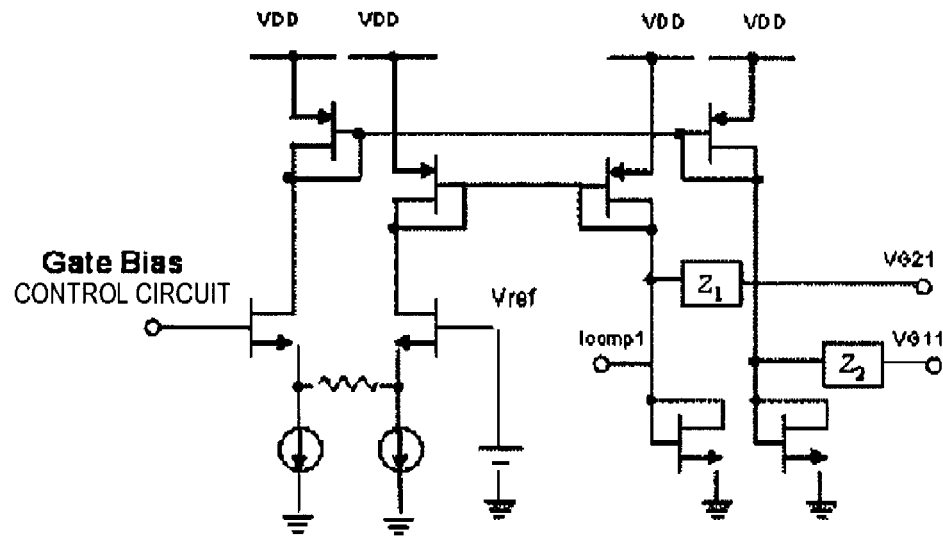
FIGS. 3A and 3B are exemplary circuit diagrams that achieve the gate biasing performance of each transistor with respect to the gain control voltage as shown in FIG. 2.
Figure 3B:
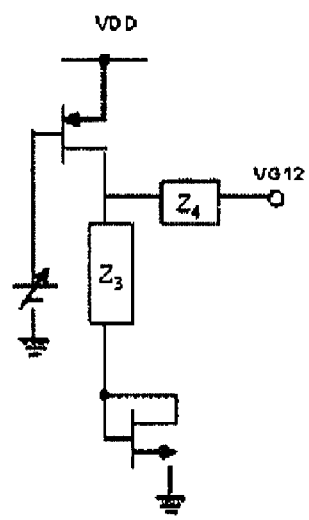

Examples of the circuits that can achieve the gate biasing performance of each transistor as shown in FIG. 2 with respect to the gain control voltage are shown in FIGS. 3A and 3B. FIG. 3A shows a bias circuit that controls the gate bias of the FET 11. Here, the gate bias for the FETs 11, 21 is generated and supplied with respect to the gain control voltage by a reflecting circuit of a current mirror circuit, based on a certain reference voltage Vref. FIG. 3B shows a bias circuit that controls the gate bias VG12 for the FETs 12, 13.

B. Under Intermediate Gain Setting 1—High Side (Range of Approx. 1.5 to 2 V)

With a decrease in control voltage from the maximum gain (in this case, in a range of 2 to 2.5 V), the gate bias VG12 for the FETs 12, 13 also drops. During this period the gate bias VG11 for the FET 11 does not fluctuate, but is providing a constant bias. In contrast, with reference to the voltage between source and drain, as the operating point moves from the saturation region to the linear region the first-stage circuit current (drain current $Ids_{NM11}$ of the FET 11) starts to decrease, and the gain similarly decreases. In this case, since the current ($Ids_{NM11}$) decreases the DC potential of the output terminal (Vdd−RL×$Ids_{NM11}$, RL is the common load resistance) increases. This leads to a decrease in linear dynamic range of the output, thereby degrading the linearity on the output side. Accordingly, a voltage equivalent to the decrease in current at the first stage is applied to the gate bias of the second-stage FET 21, so that the second-stage cascode amplifier 20 starts to operate. At this moment, a fixed voltage that causes the FET 21 to operate in the saturation region is applied to the gate bias of the cascode-connected FET 22.

Also, the gate bias for the FETs 23, 24 should satisfy VG23>>VG24, so as to allow varying the current and the gain on the drain side, i.e. the output side. Accordingly, all the current on the second stage runs to the common load through the FET 23. The DC potential of the output terminal at this moment can be expressed as {Vdd−RL×($Ids_{NM11}$+$Ids_{NM21}$)} ($Ids_{NM21}$ represents drain current of the FET 21). To increase the $Ids_{NM21}$ to make up the decrease of $Ids_{NM11}$, the linear dynamic range of the output is compensated so as to keep the DC potential from fluctuating, thus securing the linearity on the output side. At this moment the characteristic of the input signal is determined by summing the current consumed by the first-stage cascode amplifier 10 and the power contribution of the common load 121. The characteristic of the signal input to the second-stage cascode amplifier 20 via the attenuator 111 is determined by summing the current consumed thereby and the power contribution of the common load 121. Such current compensation circuit is shown in FIG. 4.

Figure 4:
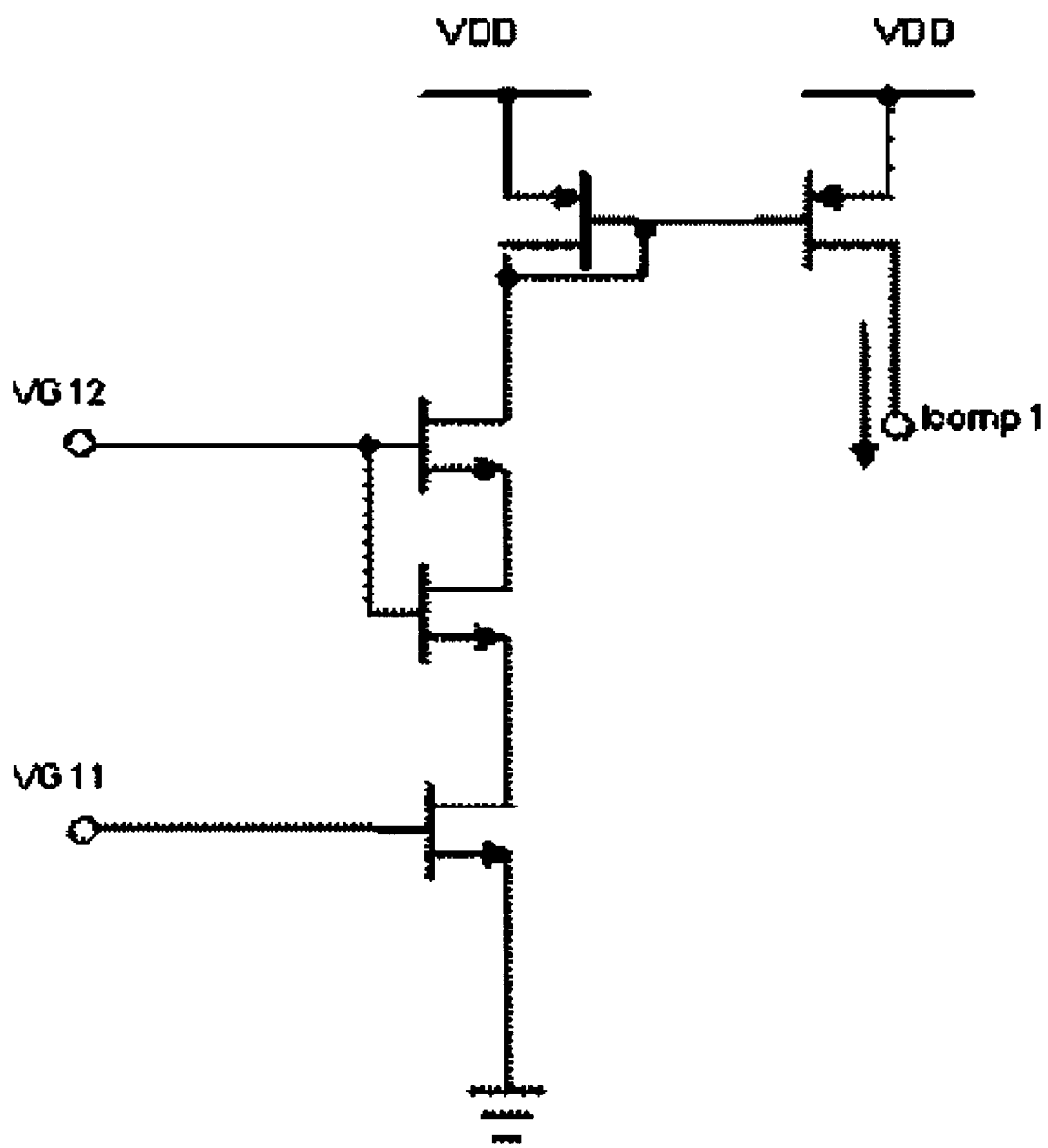
FIG. 4 is an exemplary circuit diagram of a circuit current compensation circuit.

In FIG. 4, a dummy circuit of the same structure as the input stage is provided, so as to copy and reproduce the biasing condition of the input-stage amplifier. The size of the current and the transistors in the dummy circuit is downscaled to 1/50 to 1/100, to thereby suppress the current consumption. According to the biasing condition to be applied, the dummy circuit reproduces a current converted into 1/50 to 1/100. Providing such current Icomp1 to an Icomp1 terminal in FIG. 3 allows generating the gate bias VG21.

C. Under Intermediate Gain Setting 2—Low Side (Range of Approx. 1 to 1.5 V)

The control voltage is further decreased to further lower the gate bias VG12 for the FETs 12, 13 of the first-stage cascode amplifier 10, so as to decrease the current and the gain and increase the current of the second-stage cascode amplifier 20, thereby transferring the AC operation from the first stage to the second stage. In this case, conventionally a distortion is often incurred upon applying an intense signal to the input terminal, because the first-stage current has decreased (especially with the bipolar transistor, degradation in linearity is prominent). In this embodiment, however, the operating point of the input-stage FET 11 is transferred from the saturation region to the linear region, which is more resistant to distortion, so as to prevent deviation and degradation of the linearity. In addition, the gain variable range is adjusted according to the transistor size ratio between the FETs 23, 24 on the output side of the second-stage cascode amplifier 20, and the applying state of the gate bias.

D. Under Low Gain Setting (Range of 0 to Approx. 1 V)

The control voltage is still further decreased, to further lower the gate bias VG12 for the FETs 12, 13 of the first-stage cascode amplifier 10, so as to decrease until the current can no longer run, thereby stop the DC and AC operation. The potential should be lowered to the GND level thereby prevent a residual DC bias, because otherwise the input transistor operates when an intense signal is input, thereby provoking degradation in linearity.

At this moment, only the second-stage cascode amplifier 20 is operating, through the attenuator and the input terminal. Also, the gate biasing state of the FETs 23, 24 on the output side of the second-stage cascode amplifier 20 is expressed as VG23<<VG24, and the current contribution to the common load on the output side is determined by the transistor size ratio between the FETs 23, 24, so that a final minimum gain is determined.

Advantageous effects of this embodiment will now be described. The variable-gain amplifier 1 includes the cascode amplifiers 10, 20 stacked in two stages, thereby upgrading the gain and the isolation characteristic, and thus securing a sufficiently extensive attenuation range. Under such structure, it suffices that a potential close to a saturated drain voltage is provided to the cascode-connected CMOS transistors, and hence those transistors can operate with a lower voltage than is required by a bipolar transistor. This eliminates the need to significantly increase the source voltage.

Figure 12:
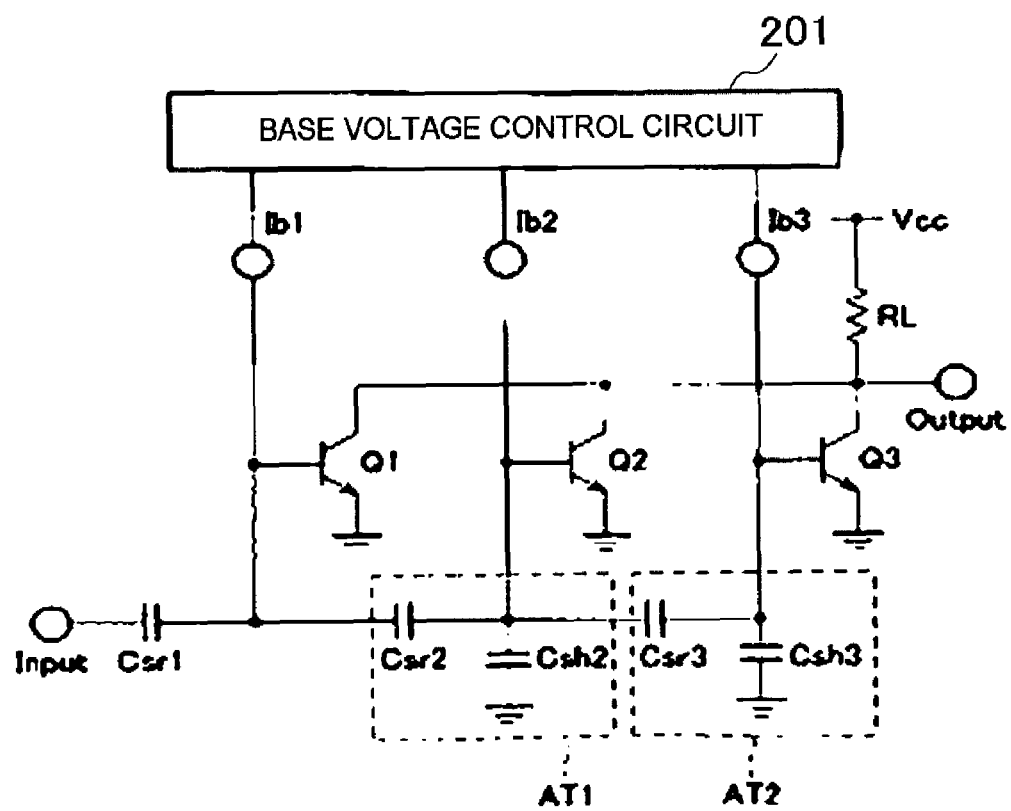
FIG. 12 is a circuit diagram of a variable-gain amplifier disclosed in Japanese Laid-open patent publication No. 2005-136846.
Figure 13:
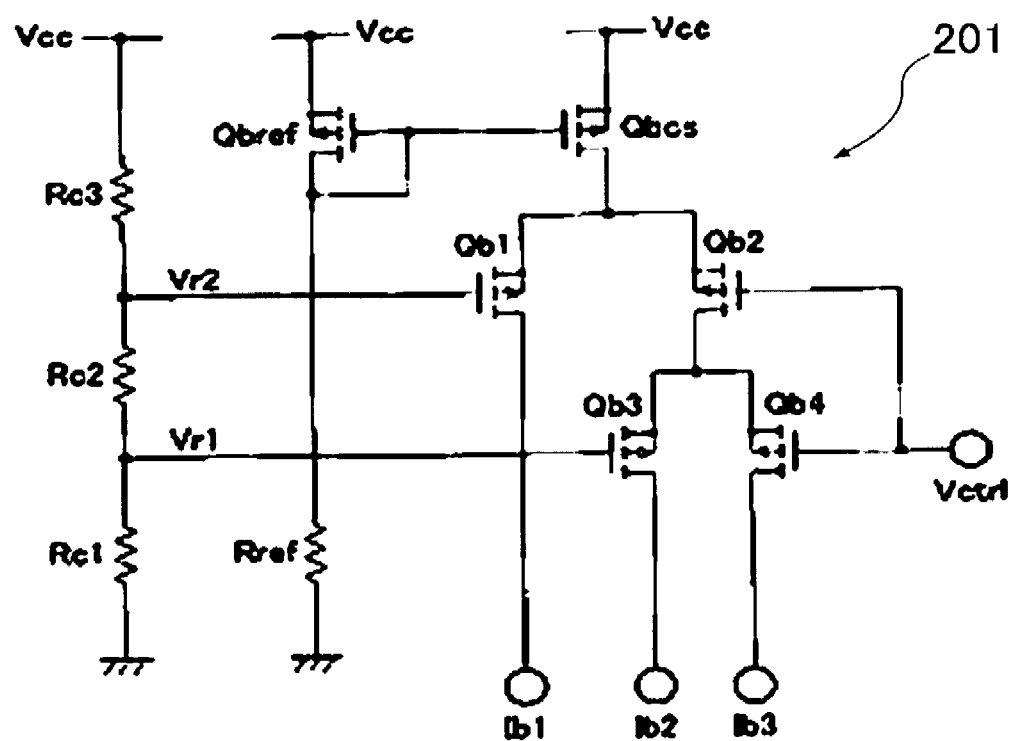
FIG. 13 is a circuit diagram of the base current control circuit in FIG. 12.
Figure 14:
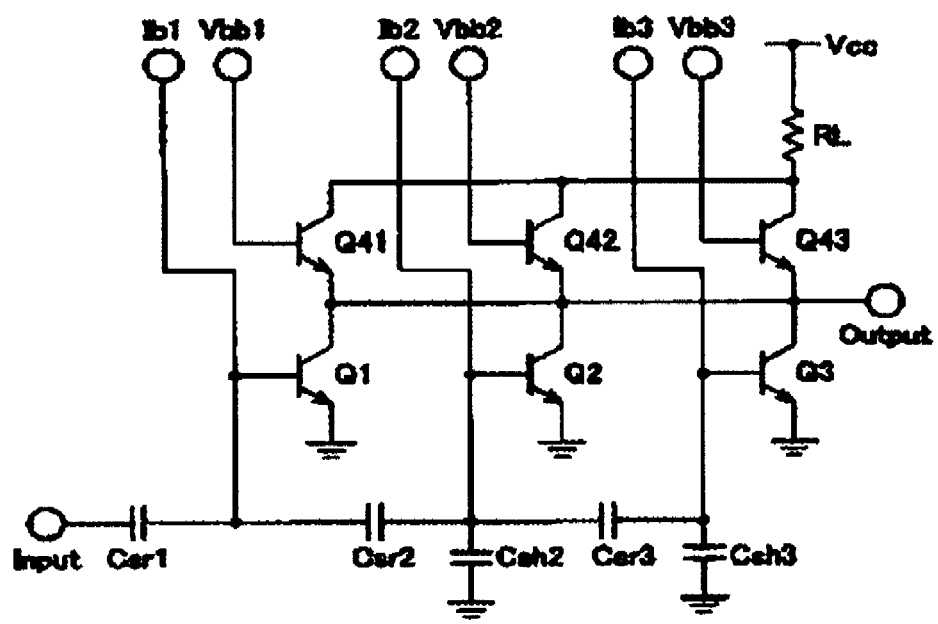
FIG. 14 is a circuit diagram of another variable-gain amplifier disclosed in Japanese Laid-open patent publication No. 2005-136846.
Figure 15:
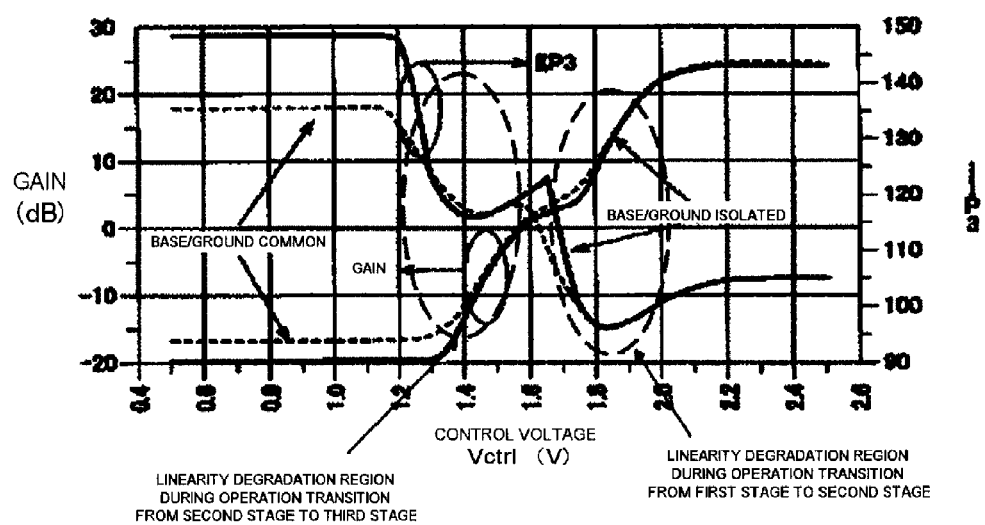
FIG. 15 is a graph for comparing control voltage dependence of the gain and the IIP3 characteristic of the amplifier of FIG. 14.

Referring back to FIG. 12, the conventional variable-gain amplifier bears a couple of drawbacks, in addition to the issue of the isolation characteristic referred to above. Firstly, when the current (operation) is switched between the transistors Q1 and Q2, for example during the gain variation under the intermediate gain setting, a state that the operating current of the first-stage transistor Q1 is very minute inevitably comes up. At this moment that that the operating current of the transistor Q1 is very minute, if an intense input signal is applied the transistor Q1 creates large distortion, thereby degrading the linearity and IIP3. During the transition of the operating current in the amplifier, none of the transistors is free from such minute current operation region, and hence from the same problem.

Secondly, the noise characteristic under the low gain setting is poor. Since the conventional circuit of FIG. 12 includes the plurality of stages of the attenuator and the amplifiers connected in parallel, the noise characteristic under the low gain setting is substantially determined by the amount of attenuation added to the input. As a result, the noise index under the low gain setting becomes unfavorable.

The first drawback is prominently observed in the amplifier including the bipolar transistors, irrespective of whether in a non-saturated or saturation region. In this embodiment, the operating region of the first-stage FET 11 is controlled to enter the linear region VDS_NM11 lower than the threshold voltage (Vt) so as to prevent the large distortion in the minute current region, to thereby prevent significant degradation. This is already covered in the foregoing passage regarding [C. Under intermediate gain setting 2—low side (range of approx. 1 to 1.5 V)].

To cope with the second drawback, in the circuit configuration the output current variable type amplifier is employed as the final-stage cascode amplifier 20, so as to allocate a part of the variation range of the attenuation, to thereby reduce the attenuation range of the attenuator 111, which is constituted of capacitors. Such arrangement can reduce the fixed attenuation amount applied at the initial stage of the amplifier, thus improving the noise index under the low gain setting.

Figure 5:
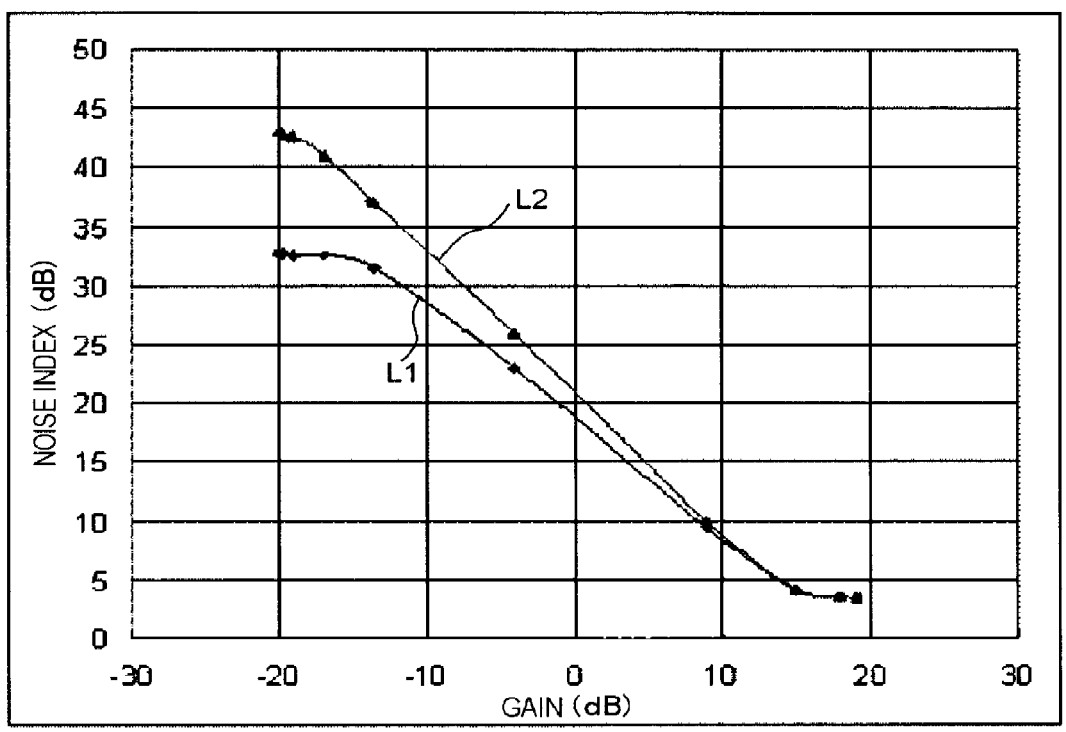
FIG. 5 is a graph showing a noise index characteristic with respect to the gain.

FIG. 5 is a graph showing a noise index characteristic with respect to the gain. In FIG. 5, lines L1 and L2 represent the characteristic of the variable-gain amplifier 1 and the conventional amplifier, respectively. The graph shows the comparison over a range from a minimum gain of −20 dB to a maximum gain of 20 dB, i.e. over a gain variation range of 40 dB. The graph proves that although the noise indices are substantially the same under the maximum gain, the indices at the same gain level become more largely different, when the gain is lowered.

In other words, in the case of the amplifier according to Japanese Laid-open patent publication No. 2005-136846, in which the variable range is exclusively controlled by the attenuator, the amount of attenuation added by the attenuator on the input side is directly reflected in the noise index, and hence increasing the attenuation range inevitably leads to a degraded noise index. With the variable-gain amplifier 1, in contrast, the attenuation range under a low gain is determined by the combination of the attenuator 111 on the input side and the current variable type amplifier (cascode amplifier 20) on the output side, a better noise characteristic can be attained when compared at a same gain level under the low gain setting because the amount of attenuation on the input side is smaller. Thus, both the noise characteristic and the linearity can be attained at the same time.

Figure 6:
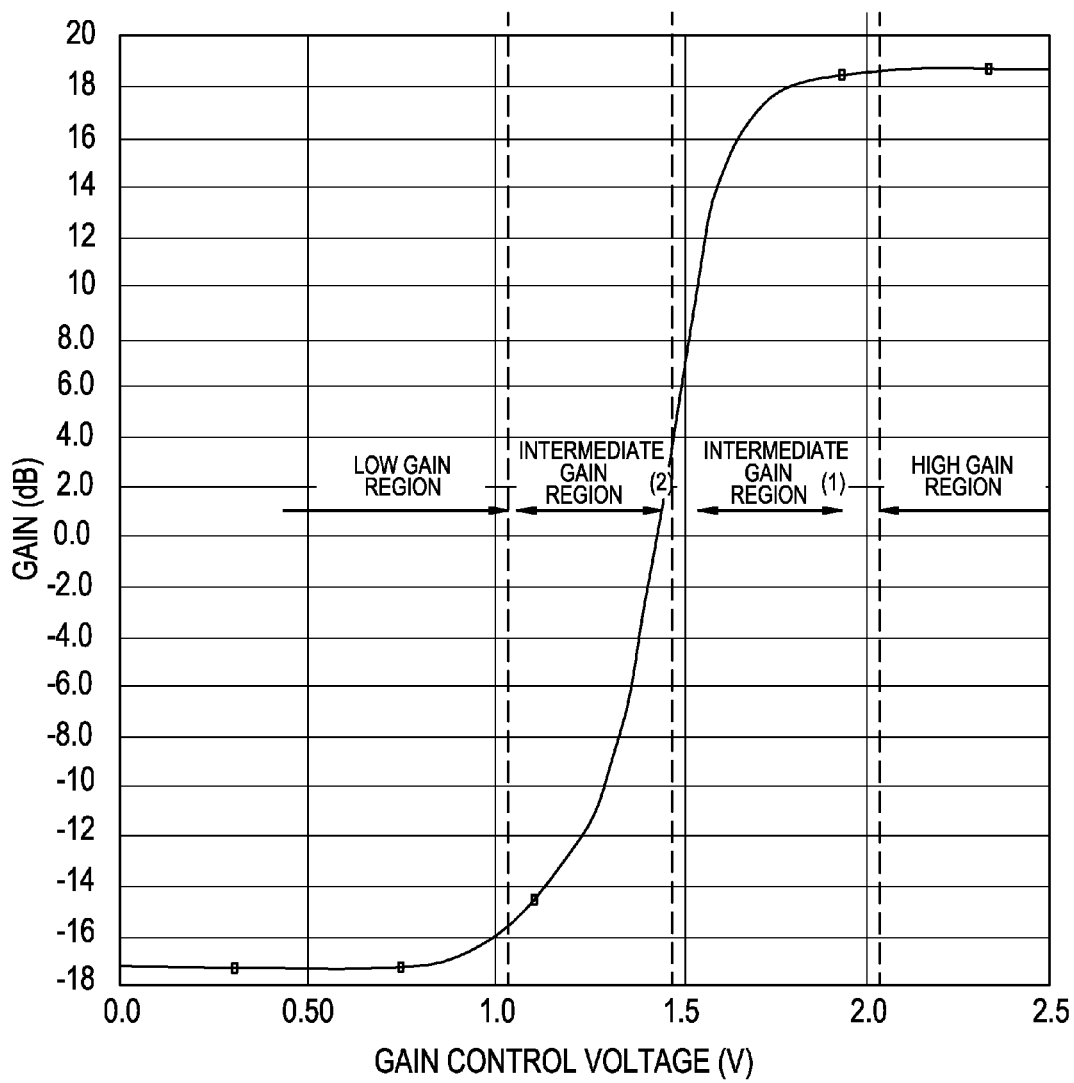
FIG. 6 is a graph showing a linear gain characteristic with respect to the gain control voltage.
Figure 7:
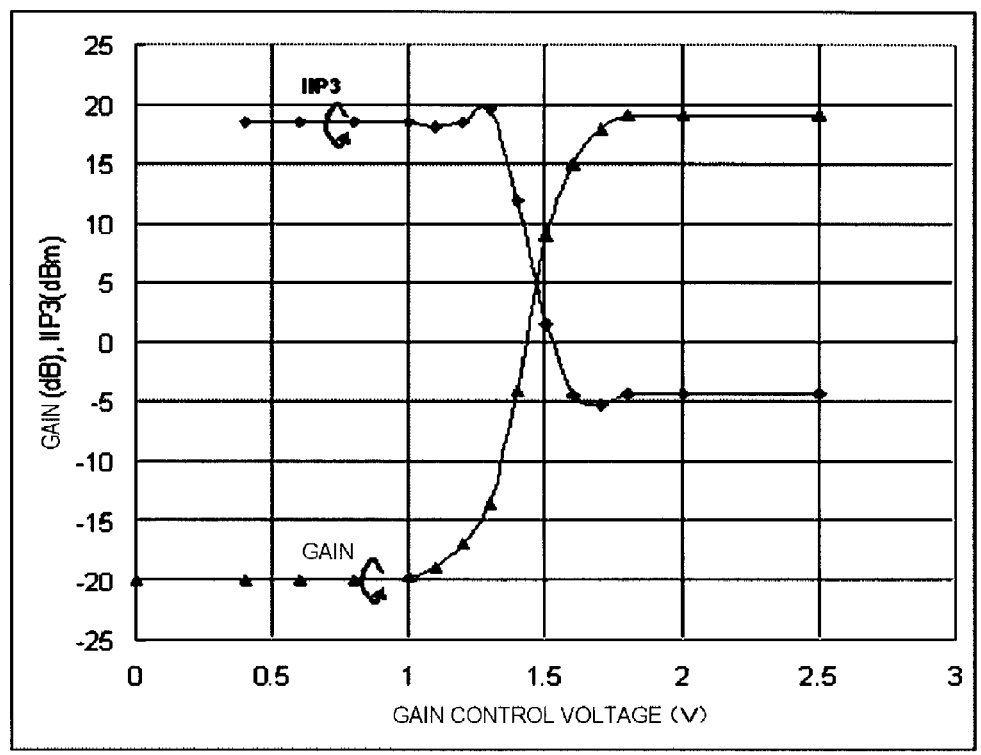
FIG. 7 is a graph showing a linear gain and IIP3 characteristic with respect to the gain control voltage.

FIG. 6 is a graph showing a linear gain characteristic of the variable-gain amplifier 1, with respect to the gain control voltage. FIG. 7 is a graph showing a linear gain and IIP3 characteristic of the variable-gain amplifier 1, with respect to the gain control voltage.

As described so far, this embodiment offers the following advantageous effects. The variable-gain amplifier 1 enables an extensive gain variation with low noise in the high frequency band, such that the low noise characteristic is attained under the high gain setting where a low signal is input, while high isolation between the I/O terminals and prevention of distortion are achieved under the low gain setting where an intense signal is input, thereby achieving high linearity.

Also, the multi-stage cascode connection can be employed without increasing the source voltage, which enables improving the gain and isolation, and achieving a CMOS analog IC without increasing the footprint on the chip.

Meanwhile, Japanese Laid-open patent publication No. 1993-259765 (No. H05-259765) discloses a high frequency, high output amplifying device including a plurality of cascode amplifiers mutually connected in parallel. Unlike the variable-gain amplifier 1, in this amplifying device the cascode amplifiers are mutually connected without mediation of an attenuator.

This amplifying device has, however, the following drawback. A receiving unit often has to secure a large negative gain and high linearity, thereby securing the linearity under intense input. The amplifying device allows lowering a base ground side gate bias of the cascode amplifier, thereby attaining a large negative gain with the current significantly reduced. However, if a high-power signal is input while the current is reduced the signal is prominently distorted in the input-side transistor, thereby degrading the linearity on the input side. The variable-gain amplifier 1 enables eliminating such problem.

SECOND EMBODIMENT

Figure 8:
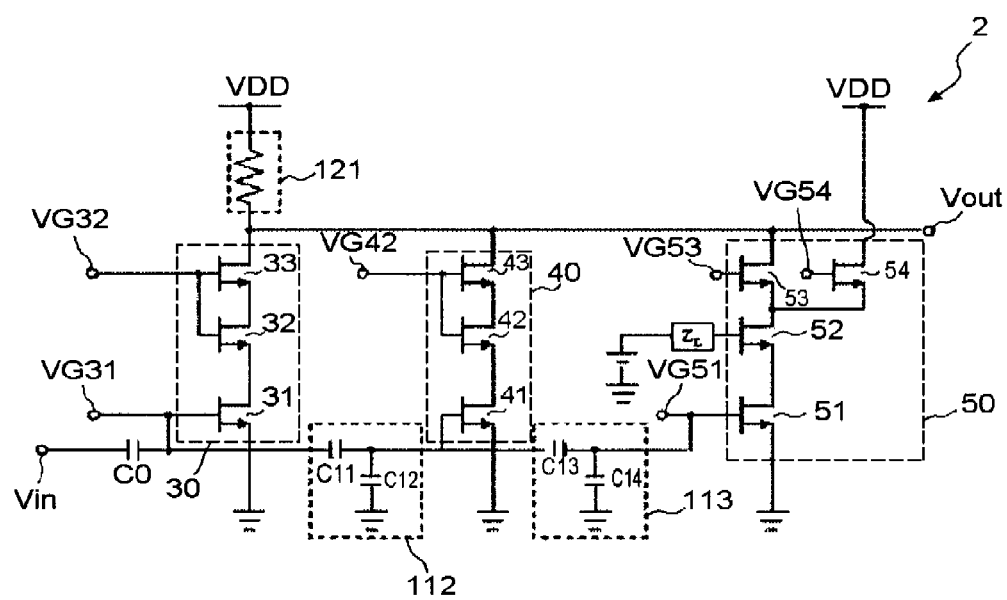
FIG. 8 is a circuit diagram of a variable-gain amplifier according to a second embodiment of the present invention.

FIG. 8 is a circuit diagram of a variable-gain amplifier according to a second embodiment of the present invention.

The variable-gain amplifier 2 includes three cascode amplifiers 30, 40, 50, and two attenuators 112, 113. The cascode amplifiers 30, 40, 50 are mutually connected in parallel, via the attenuators 112, 113. More specifically, the attenuator 112 is interposed between the cascode amplifier 30 and the cascode amplifier 40, and the attenuator 113 is interposed between the cascode amplifier 40 and the cascode amplifier 50.

The cascode amplifier 30 and the cascode amplifier 40 have a similar circuit configuration to that of the cascode amplifier 10 in FIG. 1. In other words, FETs 31, 41 correspond to the FET 11 of the cascode amplifier 10, FETs 32, 42 to the FET 12, and FETs 33, 43 to the FET 13. The cascode amplifier 50 has a similar circuit configuration to that of the cascode amplifier 20 in FIG. 1. In other words, FETs 51, 52, 53, 54 respectively correspond to the FETs 21, 22, 23, 24 of the cascode amplifier 20.

The gate of the FET 31, 51, 53, 54 is respectively connected to a gate control terminal VG31, VG51, VG53, VG54. The gate of the FET 32, 33 is connected to a gate control terminal VG32, and the gate of the FET 42, 43 to a gate control terminal VG42.

The attenuators 112, 113 also have a similar circuit configuration to that of the attenuator 111 in FIG. 1. In other words, capacitors C11, C13 correspond to the capacitor C1 of the attenuator 111, and capacitors C12, C14 to the attenuating capacitor C2. The variable-gain amplifier 2 operates according to a similar working principle to that of the variable-gain amplifier 1.

The variable-gain amplifier 2 allows further increasing the attenuation range and variable range of the gain. Theoretically, the principle allows stacking a desired number of stages, however increasing the number of stages results in an increased number of transistors connected to the output terminal, thereby incurring an increase in parasitic capacitance. This leads to degradation in gain characteristic in a high frequency band, which makes the amplifier unsuitable for the high frequency characteristic. Consequently, it is preferable not to exceed a three-stage parallel connection.

Also, in the integration process in general, a passive capacitance element occupies a larger footprint than a transistor. Accordingly, since an equal variable range of the gain can be achieved with a fewer number of capacitors or a lesser capacitance value than in the conventional structure, the footprint of the variable-gain amplifier can be reduced in the integration process. Other advantageous effects of this embodiment are similar to those offered by the variable-gain amplifier 1.

THIRD EMBODIMENT

Figure 9:
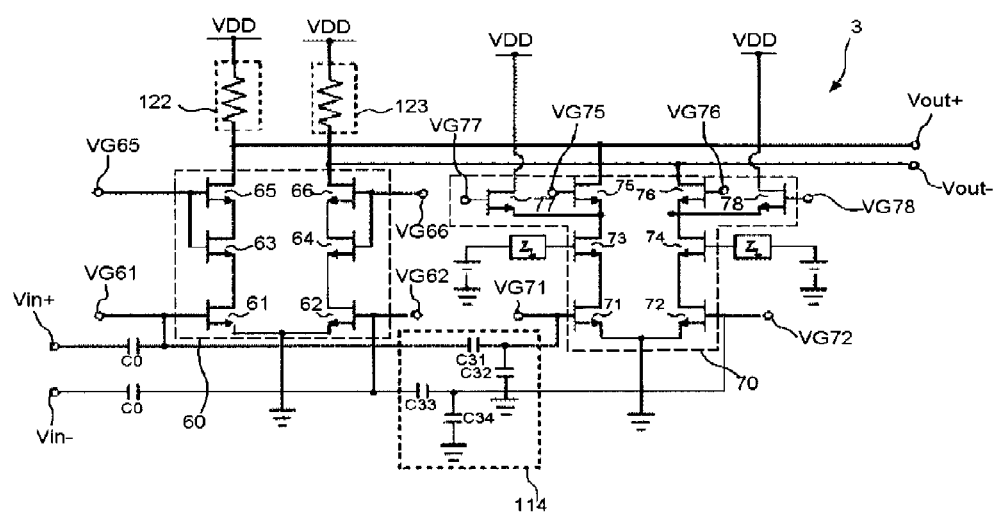
FIG. 9 is a circuit diagram of a variable-gain amplifier according to a third embodiment of the present invention.

FIG. 9 is a circuit diagram of a variable-gain amplifier according to a third embodiment of the present invention. The variable-gain amplifier 3 includes cascode amplifiers 60, 70, and an attenuator 114. The cascode amplifiers 60, 70 are mutually connected in parallel via the attenuator 114.

The cascode amplifier 60 includes FETs 61 to 66. The FETs 61, 63, 65 are cascode-connected in a similar manner to the FETs 11, 12, 13 in FIG. 1. The gate of the FET 61 is connected to a non-inverted input terminal Vin+. The drain of the FET 65 is connected to a load 122.

The FETs 62, 64, 66 are also cascode-connected in a similar manner to the FETs 11, 12, 13 in FIG. 1. The gate of the FET 62 is connected to an inverted input terminal Vin−. The drain of the FET 66 is connected to a load 123.

The cascode amplifier 70 includes FETs 71 to 78. The FETs 71, 73, 75 are cascode-connected in a similar manner to the FETs 21, 22, 23 in FIG. 1. The FET 77 has the source connected to the source of the FET 75, and the drain connected to the power source VDD. The gate of the FET 71 is connected to the non-inverted input terminal Vin+ via the attenuator 114. The drain of the FET 75 is connected to the load 122.

The FETs 72, 74, 76 are also cascode-connected in a similar manner to the FETs 21, 22, 23 in FIG. 1. The FET 78 has the source connected to the source of the FET 76, and the drain connected to the power source VDD. The gate of the FET 72 is connected to the inverted input terminal Vin− via the attenuator 114. The drain of the FET 76 is connected to the load 123.

The gate of the FET 61, 62, 71, 72, 75, 76, 77, 78 is connected to a gate control terminal VG61, VG62, VG71, VG72, VG75, VG76, VG77, VG78, respectively. The respective gate of the FETs 63, 65 is connected to the gate control terminal VG65, and the respective gate of the FETs 64, 66 is connected to the gate control terminal VG66.

The attenuator 114 includes capacitors C31 to C34. The capacitor C31 is provided on a signal path between the non-inverted input terminal Vin+ and the cascode amplifier 70. The capacitor C32 is provided between the ground, and the signal path between the capacitor C31 and the cascode amplifier 70. capacitor C33 is provided on a signal path between the inverted input terminal Vin− and the cascode amplifier 70. The capacitor C34 is provided between the ground, and the signal path between the capacitor C33 and the cascode amplifier 70. The variable-gain amplifier 3 operates according to a similar working principle to that of the variable-gain amplifier 1.

The variable-gain amplifier 3 may be suitably employed when the I/O interface needs a differential signal. In the case of a mobile wireless terminal system in particular, the terminal apparatus generally includes a band-path filter directly connected to the antenna for eliminating an unnecessary signal. Many of such band-path filters are of a balun type which receives a single-phase signal and outputs a differential signal, and the signal interface can be accordingly adjusted for the system. Thus, a circuit appropriate for the system can be provided, without taking unnecessary loss into consideration. Other advantageous effects of this embodiment are similar to those offered by the variable-gain amplifier 1.

FOURTH EMBODIMENT

Figure 10:
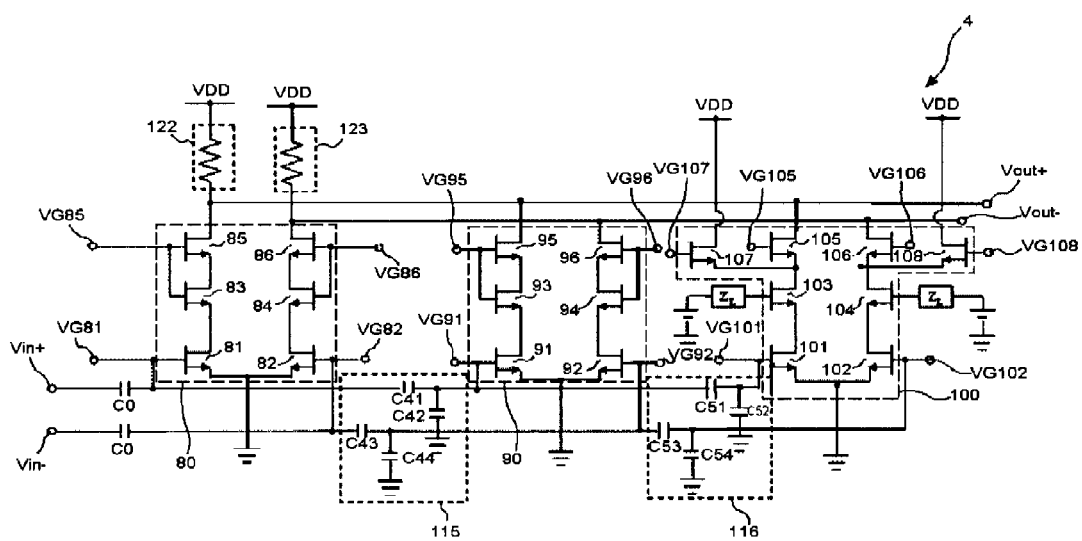
FIG. 10 is a circuit diagram of a variable-gain amplifier according to a fourth embodiment of the present invention.

FIG. 10 is a circuit diagram of a variable-gain amplifier according to a fourth embodiment of the present invention. The variable-gain amplifier 4 includes cascode amplifiers 80, 90, 100, and attenuators 115, 116. The cascode amplifiers 80, 90, 100 are mutually connected in parallel, via the attenuators 115, 116. More specifically, the attenuator 115 is interposed between the cascode amplifier 80 and the cascode amplifier 90, and the attenuator 116 is interposed between the cascode amplifier 90 and the cascode amplifier 100.

The cascade amplifier 80 and the cascode amplifier 90 have a similar circuit configuration to that of the cascode amplifier 60 in FIG. 9. In other words, FETs 81, 91 correspond to the FET 61 of the cascode amplifier 60, FETs 82, 92 to the FET 62, FETs 83, 93 to the FET 63, FETs 84, 94 to the FET 64, FETs 85, 95 to the FET 65, and FETs 86, 96 to the FET 66. The cascade amplifier 50 has a similar circuit configuration to that of the cascode amplifier 70 in FIG. 9. Specifically, FETs 101, 102, 103, 104, 105, 106, 107, 108 respectively correspond to the FETs 71, 72, 73, 74, 75, 76, 77, 78 of the cascade amplifier 70.

The gate of the FET 81, 82, 91, 92, 101, 102, 105, 106, 107, 108 is connected to a gate control terminal VG81, VG82, VG91, VG92, VG101, VG102, VG105, VG106, VG107, VG108, respectively. The gate of the RET 83, 85 is connected to a gate control terminal VG85, the gate of the FET 84, 86 to a gate control terminal VG86, the gate of the FET 93, 95 to a gate control terminal VG95, and the gate of the FET 94, 96 to a gate control terminal VG96.

The attenuators 115, 116 also have a similar circuit configuration to that of the attenuator 114 in FIG. 9. In other words, capacitors C41, C51 correspond to the capacitor C31 of the attenuator 114, capacitors C42, C52 to the capacitor C32, capacitors C43, C53 to the capacitor C33, and capacitors C44, C54 to the capacitor C34. The variable-gain amplifier 4 operates according to a similar working principle to that of the variable-gain amplifier 1.

The variable-gain amplifier 4 allows further increasing the attenuation range and variable range of the gain. Also, the variable-gain amplifier 4 may be suitably employed when the I/O interface needs a differential signal. Other advantageous effects of this embodiment are similar to those offered by the variable-gain amplifier 1.

The variable-gain amplifier according to the present invention is not limited to the foregoing embodiments, but various modifications may be made.

Figure 11:
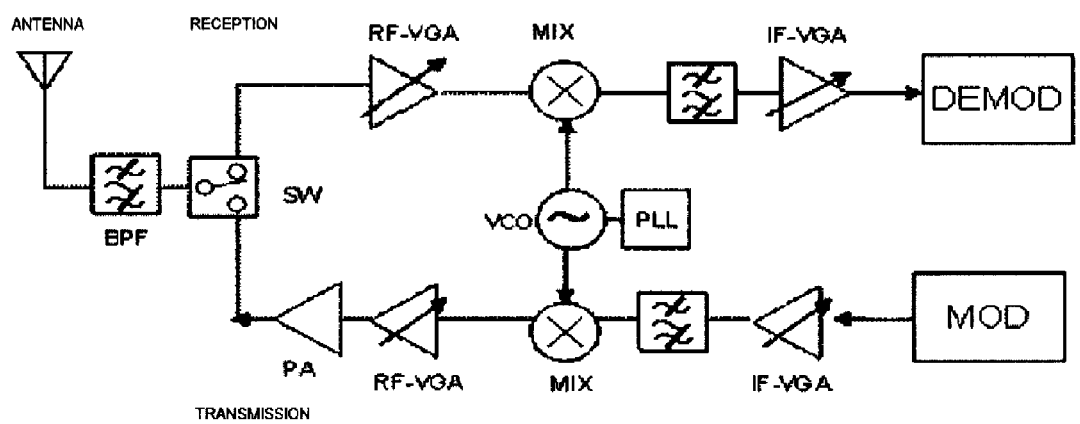
FIG. 11 is a block diagram showing a system configuration of a popular wireless communication terminal.

The present invention may be suitably applied to a variable-gain amplifier to be employed for processing signals in a mobile wireless communication apparatus (Ref. FIG. 11) such as a transceiver or a mobile phone terminal, in particular for processing signals in a first stage of a receiving unit.

It is apparent that the present invention is not limited to the above embodiment, and may be modified and changed without departing from the scope and spirit of the invention.

What is claimed is:

1. A variable-gain amplifier comprising:
   n number/numbers of cascode amplifiers each including a plurality of cascode-connected field effect transistors, n being an integer not fewer than two; and
   an attenuator;
   wherein said n number/numbers of cascode amplifiers are mutually connected in parallel via said attenuator,
   wherein a first-stage cascode amplifier among the n number/numbers of cascode amplifiers comprises a first field effect transistor among the plurality of cascode-connected field effect transistors, and
   wherein an operating point of the first field effect transistor is transferred from a saturation region to a linear region during an intermediate stage of operation of the variable-gain amplifier.

2. The variable-gain amplifier according to claim 1, wherein said field effect transistor is of a MOS type.

3. The variable-gain amplifier according to claim 1, wherein a first cascode amplifier of said n number/numbers of cascode amplifiers is connected to an input terminal of said variable-gain amplifier;
   a j-th cascode amplifier of said n number/numbers of cascode amplifiers is connected to said input terminal via (j-1) number/numbers of said attenuators, j being an integer not fewer than two and not greater than n.

4. The variable-gain amplifier according to claim 3, wherein an n-th cascode amplifier of said n number/numbers of cascode amplifiers is an output current variable type amplifier.

5. The variable-gain amplifier according to claim 4, further comprising a load to which an output terminal of each of said cascode amplifiers is connected;
   wherein said n-th cascode amplifier includes a first and a second field effect transistor having respective sources thereof mutually connected; and
   a drain of said first and said second field effect transistor is connected to said load and to a power source, respectively.

6. The variable-gain amplifier according to claim 1, wherein said n is two.

7. The variable-gain amplifier according to claim 1, wherein said cascode amplifier is of a differential type.

8. The variable-gain amplifier according to claim 1, wherein the n number/numbers of cascode amplifiers comprises a second-stage cascode amplifier, and during the intermediate stage of operation of the variable-gain amplifier, current supplied to the first-stage cascode amplifier is decreasing and current supplied to the second-stage cascode amplifier is increasing.

9. The variable-gain amplifier according to claim 8, wherein a gate bias control circuit supplies the current to the first-stage and second-stage cascode amplifiers in response to a control voltage.

10. The variable-gain amplifier according to claim 9, wherein a range of the control voltage during the intermediate stage of operation is 1 to 1.5 Volts.

* * * * *